(12) United States Patent
Boys et al.

(10) Patent No.: US 10,970,434 B2
(45) Date of Patent: *Apr. 6, 2021

(54) VARIABLE EQUIVALENCY ON CONNECTION IN A PROCESS SIMULATION

(71) Applicant: AVEVA SOFTWARE, LLC, Lake Forest, CA (US)

(72) Inventors: Ian Boys, Vista, CA (US); David H. Jerome, La Habra, CA (US); Douglas Paul Kane, Silverado, CA (US); Cal DePew, Irvine, CA (US); Sangeetha Barla, Mission Viejo, CA (US); Wen-Jing Lin, Sugar Land, TX (US)

(73) Assignee: AVEVA SOFTWARE, LLC, Lake Forest, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/411,282

(22) Filed: May 14, 2019

(65) Prior Publication Data
US 2020/0104438 A1    Apr. 2, 2020

Related U.S. Application Data

(63) Continuation of application No. 14/570,873, filed on Dec. 15, 2014, now Pat. No. 10,318,665.

(51) Int. Cl.
| | | |
|---|---|---|
| *G05B 19/00* | (2006.01) | |
| *G05B 17/02* | (2006.01) | |
| *G06F 30/20* | (2020.01) | |

(52) U.S. Cl.
CPC ............. *G06F 30/20* (2020.01); *G05B 17/02* (2013.01); *G05B 19/00* (2013.01)

(58) Field of Classification Search
CPC .......... G06F 30/20; G05B 17/02; G05B 19/00
See application file for complete search history.

(56) References Cited

U.S. PATENT DOCUMENTS 5,038,269 A    8/1991   Grimble et al.
5,564,049 A    10/1996  Schmidt
(Continued)

FOREIGN PATENT DOCUMENTS

EP    1061464    * 12/2000    ............ G06F 17/50

OTHER PUBLICATIONS

Curlett, B. "Object-Oriented Approach for Gas Turbine Engine Simulation" NASA Technical Memo 106970 [retrieved on Sep. 8, 2020 ]. (Year: 1995).*

(Continued)

*Primary Examiner* — Rehana Perveen
*Assistant Examiner* — Alfred H B Wechselberger
(74) *Attorney, Agent, or Firm* — Greenberg Traurig, LLP (57) ABSTRACT

A system for developing a simulation of a process. In one aspect, a system creates a first model within the simulation. The first model represents a part of the process and comprises a first port to which other models may be connected. The system also creates a second model within the simulation. The second model represents another part of the process and comprises a second port to which other models may be connected. The system then connects the first port and the second port together. Upon connection, the system allocates a memory location as a connection variable that represents a type of information transfer between the first and second ports. A first port variable, which represents a value transferrable through the first port, is set to reference the value at the allocated memory location. Similarly, a second port variable, which represents a value transferrable through the second port, is also set to reference the value at the allocated memory location.

17 Claims, 6 Drawing Sheets

(56) References Cited

U.S. PATENT DOCUMENTS

| | | | |
|---|---|---|---|
| 6,442,515 B1* | 8/2002 | Varma | G06F 8/38 |
| | | | 700/28 |
| 6,853,920 B2 | 2/2005 | Hsiung et al. | |
| 6,980,939 B2 | 12/2005 | Dhir et al. | |
| 8,849,589 B2 | 9/2014 | Wiklund et al. | |
| 9,170,579 B1 | 10/2015 | Witter et al. | |
| 9,223,910 B1* | 12/2015 | Ghosh | G06F 30/33 |
| 2007/0239293 A1 | 10/2007 | Tanartkit et al. | |
| 2013/0211601 A1 | 8/2013 | Cheng et al. | |
| 2015/0066463 A1* | 3/2015 | Shetty | G06G 7/32 |
| | | | 703/10 |
| 2015/0293883 A1 | 10/2015 | Shibahara | |
| 2016/0098502 A1 | 4/2016 | Havre et al. | |
| 2016/0147205 A1 | 5/2016 | Kaufman | |

OTHER PUBLICATIONS

Aronsson, P. "Automatic Parallelization of Equation-Based Simulation Programs" [Thesis] Linkoping Studies in Science and Technology, Dissertation No. 1022, Chapter 3 [retrieved on Sep. 8, 2020]. (Year: 2006).*

"Pro/II 5.0 User's Guide." Simulation Sciences, 1997 [retrieved on Apr. 24, 2017]. Retrieved from <http://jmdsdf.yi.org/queens/year5/fall/Chee470%20-%20Design%20of%Manufacturing%20Processes/cd(CHEE470)/00(Tools%20and%20Concepts)/05(PRO-II)/10(User's%20Guide).pdf>.

"Pro/II 7.1 Tutorial Guide." Invensys, 2005 [retrieved on Apr. 27, 2017]. Retrieved from scribd.com.

"Aspen Plus User Guide." Aspen Technology, version 10.2, Feb. 2000 [retrieved on Apr. 25, 2017]. Retrieved from <https://web.ist.utl.pt/ist11038/acad/Aspen/AspUserGuide10.pdf>.

\* cited by examiner

VARIABLE EQUIVALENCY ON CONNECTION IN A PROCESS SIMULATION

CROSS-REFERENCE TO RELATED APPLICATIONS

This application is a continuation of U.S. application Ser. No. 14/570,873, filed Dec. 15, 2014, entitled "Variable Equivalency on Connection in a Process Simulation", now issued as U.S. Pat. No. 10,318,665, all of which is hereby incorporated by reference for all purposes.

BACKGROUND

Industry increasingly depends upon highly automated data acquisition and control systems to ensure that industrial processes are run efficiently, safely and reliably while lowering their overall production costs. Data acquisition begins when a number of sensors measure aspects of an industrial process and periodically report their measurements back to a data collection and control system. Such measurements come in a wide variety of forms. By way of example, the measurements produced by a sensor/recorder include: a temperature, a pressure, a pH, a mass/volume flow of material, a tallied inventory of packages waiting in a shipping line, or a photograph of a room in a factory. More particularly, aspects of the present invention relate to systems and methods for using tools that are designed to model and simulate the process in order to optimize the process. The use of these modeling and simulation functions allows a user to capture the economic benefit from industrial processes such as refinery, chemical or petrochemical plant operations. Such models make use of known and acquired data from a process to accurately simulate the behavior of the process.

Typical industrial processes are extremely complex and receive substantially greater volumes of information than any human could possibly digest in its raw form. By way of example, it is not unheard of to have thousands of sensors and control elements (e.g., valve actuators) monitoring/controlling aspects of a multi-stage process within an industrial plant. These sensors are of varied type and report on varied characteristics of the process. Their outputs are similarly varied in the meaning of their measurements, in the amount of data sent for each measurement, and in the frequency of their measurements. As regards the latter, for accuracy and to enable quick response, some of these sensors/control elements take one or more measurements every second. Multiplying a single sensor/control element by thousands of sensors/control elements (a typical industrial control environment) results in an overwhelming volume of data flowing into the manufacturing information and process control system. Sophisticated data management and process visualization techniques have been developed to handle the large volumes of data generated by such system.

Due to this complexity, it is a difficult but vital task to ensure that the process is running efficiently. Although modeling the process for the purpose of simulating it is known, the challenges involved in creating and using a simulation model of a process include ensuring the accuracy of the model and responsive performance of the simulation while running. Simulation of a process requires solving large systems of equations, which can be extremely time-consuming and processing intensive.

SUMMARY

Briefly, aspects of the present invention involve a system that models the process for the purpose of simulating it accurately. The simulation can be used to locate any inefficiency in the current process and determine alterations that can improve or eliminate inefficiencies. Advantageously, aspects of the present invention ensure the accuracy of the model and responsive performance of the simulation while running. Moreover, such aspects facilitate the solving of large systems of equations for use in generating the simulation.

In one aspect, a system for developing a simulation of a process is described. In one aspect, a system creates a first model within the simulation. The first model represents a part of the process and comprises a first port to which other models may be connected. The system also creates a second model within the simulation. The second model represents another part of the process and comprises a second port to which other models may be connected. The system then connects the first port and the second port together. Upon connection, the system allocates a memory location as a connection variable that represents a type of information transfer between the first and second ports. A first port variable, which represents a value transferrable through the first port, is set to reference the value and other properties at the assigned memory location. Similarly, a second port variable, which represents a value transferrable through the second port, is also set to reference the value at the allocated memory location. In this manner, the simulation can run faster at least in part because, for example, the underlying solution matrix is smaller.

In another aspect, a system for developing a simulation of a process is described. A system creates a model within the simulation. The model represents a part of the process and comprises a first port to which other models may be connected. The system also creates a sub-model within the simulation. The second model represents a sub-part of the part of the process and comprises a second port to which other models may be connected. The system then defines a connection between the first port and the second port. Upon connection, the system allocates a memory location as a connection variable that represents a type of information transfer between the first and second ports. A first port variable, which represents a value transferrable through the first port, is set to reference the value and other properties at the assigned memory location. Similarly, a second port variable, which represents a value transferrable through the second port, is also set to reference the value at the allocated memory location. In this manner, the simulation can run faster at least in part because, for example, the underlying solution matrix is smaller.

In another form, a processor executable method is provided.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Other features will be in part apparent and in part pointed out hereinafter.

BRIEF DESCRIPTION OF THE DRAWINGS

Corresponding reference characters indicate corresponding parts throughout the drawings.

DETAILED DESCRIPTION

Aspects of the present invention generally relate to the fields of networked computerized industrial control, automation systems and networked computerized systems utilized to monitor, log, and display relevant manufacturing/production events and associated data, and supervisory level control and manufacturing information systems. Such systems generally execute above a regulatory control layer in a process control system to provide guidance to lower level control elements such as, by way of example, programmable logic controllers or distributed control systems (DCSs). Such systems are also employed to acquire and manage historical information relating to such processes and their associated output. More particularly, aspects of the present invention relate to systems and methods for using tools employing calculations that are designed model and simulate the process in order to optimize the process. The use of these modeling and simulation functions allows a user to capture the economic benefit from processes such as refinery, chemical or petrochemical plant operations.

The described system provides improved simulation performance by improving the rate at which groups of representative mathematical equations can be solved during the simulation process. A simulation model is created to accurately represent and predict the behavior of an actual process control system. An accurate simulation model enables users to observe likely results of changes made to the process control system without the significant cost of altering the actual process control system before knowing the results. Additionally, a simulation model can enable a user to detect significant changes in the performance of the process control system as well as determine what may be causing those changes in performance.

A simulation model of an entire process control system may be made up of many smaller and simpler models that represent individual devices and other pieces of the process control system. For instance, there may be models representing tanks for holding materials and pumps for moving materials through pipes. Each of the models in the simulation may have a variety of parts, including inputs, outputs, parameters, and variables. Each model may also have associated mathematical equations designed to simulate the behavior of the model. In an embodiment, the equations represent certain relationships between parameters and variables within the model. And in an embodiment, the model is made up of sub-models, which represent individual parts of a device that make up the represented device in the process control system.

In many cases, equations are created to represent the behavior of models and the connection of an output of one model to an input of another model or the connection of an input or output of a sub-model to the input or output of the parent model of the sub-model. These equations are typically simple equivalencies of the variables associated with the inputs or outputs. For example, if a model Source1 has a variable T (temperature) and the value of that temperature needs to be equated to another temperature variable in a sub-model (Source1.Submodel.T), then the system can introduce an equation "Source1.T=Source1.Submodel.T" to represent this relationship.

A complex process control system model can contain hundreds or even thousands of different models and many of them are connected to each other in this way. As a result, hundreds of simple equivalence equations like the one described above are created. In simulating the process control system, the equations of the simulation model must be solved as a group of equations repeatedly. The inclusion of the equivalency equations significantly increases the size of the group of equations to be solved. The number of the equivalency equations being solved can be reduced by the described system changing how the equations are treated by the simulation. The designed system treats the simple equivalency equations as a result of a connection between models as a reference from the models to a single connection variable, rather than an equation setting two variable equal to each other. In this way, the simple equivalency equations are not treated as equations that need to be solved in the group of simulation equations. Instead, the connected variables are now treated as references to a single memory location or variable, which is used to replace the values and other properties of the connected variables in any other equations of the group of simulation equations.

Figure 1:
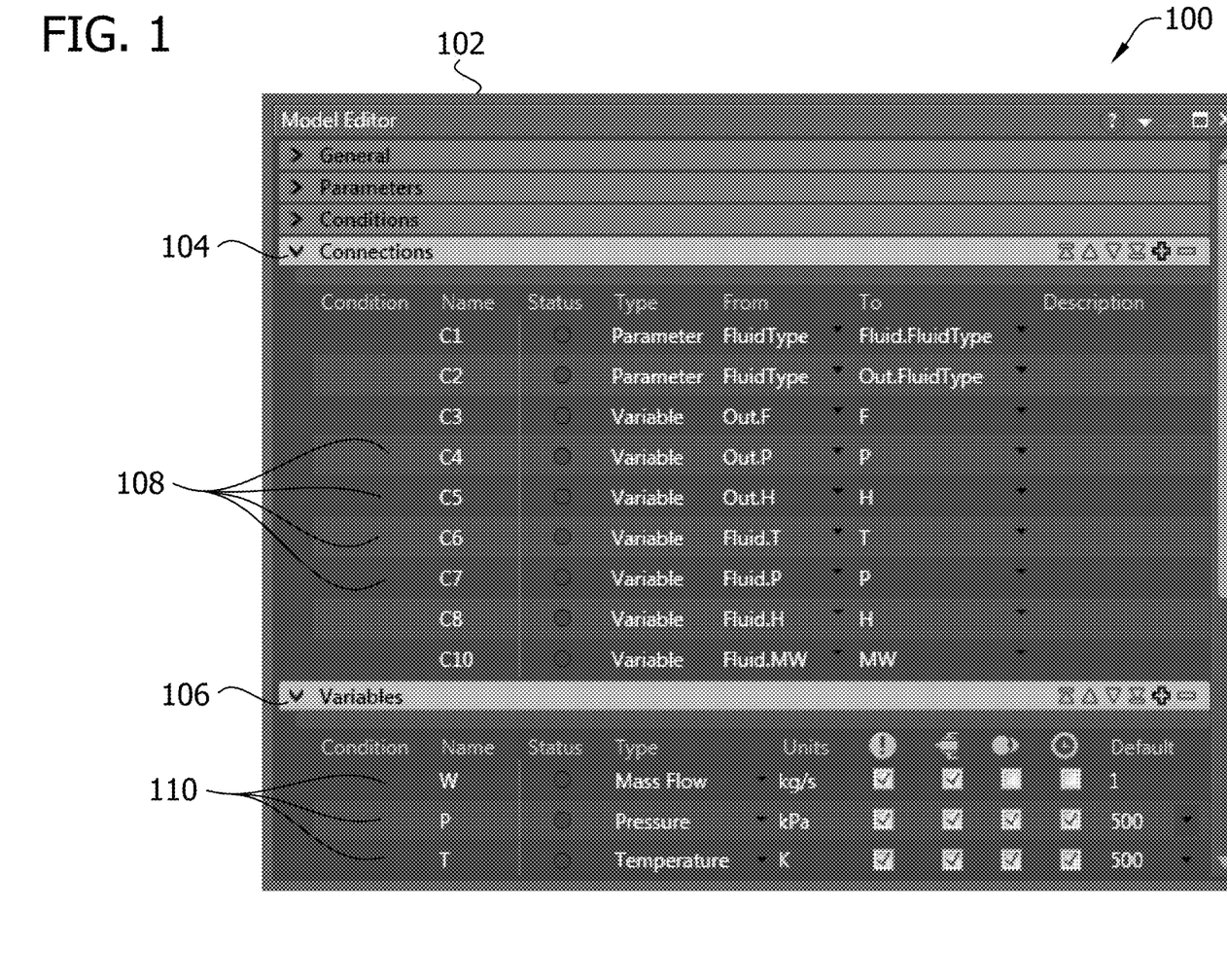
FIG. 1 is an example of a Model Editor window for defining connections between variables within a model in the process simulation.

FIG. 1 shows an example of a screen 100 displaying a Model Editor window 102. In an embodiment, the Model Editor 102 enables a user to create connections between variables and parameters via a computer system. The Model Editor 102 is where a user creates and modifies models representing process equipment, controls, and other mathematical relationships. A user can create custom models that include equations. The Model Editor 102 is used to define variables 106 and connections 104 in models that represent the process control system. The Model Editor 102 defines new models or edits existing models to fit specific requirements. A user can use the Model Editor 102 to build a hierarchy of models and sub-models, where complex models are built out of smaller sub-models. This allows a user to create custom building blocks that can greatly increase the efficiency of building complex systems. In an embodiment, the sub-models of a model may include ports, which are specialized sub-models that enable the model to be connected to other models on a flowsheet. A user can add ports to models to determine how the models can connect and interact with each other.

The illustrated Model Editor 102 contains information tabs including a Connections tab 104 and a Variables tab 106. The Connections tab enables a user to create the connections between parameters and variables as discussed above. The connections that have been formed are represented on rows 108 of the Connections tab 104. Each row 108 shows information about a particular connection, including connection name, status, type, where the connection is coming from, where the connection is going to, and a description of the connection. For instance, a row 108 shows information about a connection C4, which has a type of "variable" and is connected from the variable "Out.P" to the variable "P". This connection may be the result of connecting a sub-model within the present model to variables of the present model. For instance, the "Out.P" variable may be an output from a sub-model called "Out". The "P" variable, in turn, is a variable represented within the present model.

The Variables tab 106 shows rows 110 with information about variables from the present model. As mentioned above, the "P" variable is shown here in a row 110 and information about the variable is also given. For example, variable "P" has a type of "Pressure", a unit of "kPa", and a default of 500. Because connection C4 has been created from "Out.P" to "P", the system can track the connection without the use of an equivalence equation, instead treating references to "Out.P" and "P" as references to a single memory location or variable representing the current pressure level of the connected variables.

A model editor 102 may include a method of forming connections between a model and its sub-models in a simulation. This may include drop down menus or other GUI controls for configuring the connection. For instance, the "from" field and "to" field in the connection row may enable a drop down menu featuring possible selections. A user may define the new connection as having a particular type. In an embodiment, a connection may be defined as having a "variable" type or a "parameter" type. Additionally, compatibility between the "to" field and the "from" field of the connection may be detected and enforced. For instance, if the "from" variable is a "Temperature" variable and the "to" variable is a "Pressure" type variable, the system may detect that they are not compatible and indicate to the user that the connection is invalid. This may be in the form of an error symbol, tool tip, popup, or the like providing information about the variable type mismatch. Also, when the connection expects an array variable having an expected dimension, if a connected model represents a non-matching data dimension, then the error notification can be used to alert a user of the mismatch.

The system is capable of determining validity of connections in the simulation by validating dimensional consistency of the representative mathematical equations of the connected models. When models are connected, the variables and the representative equations of the models interact. In an embodiment, the variables of the models have assigned units of measure that reveal information about what type of data the variable represents. If the units of measure of the variables from the connected models are not consistent across the mathematical equations, the system flags the connection or variable as being invalid.

A model comprises, for example, one or more ports representing interfaces for transferring data into and out of the model. In an embodiment, the ports of a model each transfer a different type of data. Some ports require input data from another source for the model to function. Those skilled in the art will appreciate that ports may have a type that determines the type of information the port expects to transfer. A port can represent some physical aspect of the process control system, like the flow of a fluid from the model to an attached model, or a type of data representing a measurement of the process control system, like the results of a temperature sensor detecting the temperature inside a tank of fluid. Connecting two models together as described may require the connection of compatible ports on each model.

In an embodiment, the system enables connection between compatible ports on models. Each port has a type, and the system may only allow connection between ports associated with the same types. The system may not allow a user to connect a pressure port to a temperature port.

Figure 2:
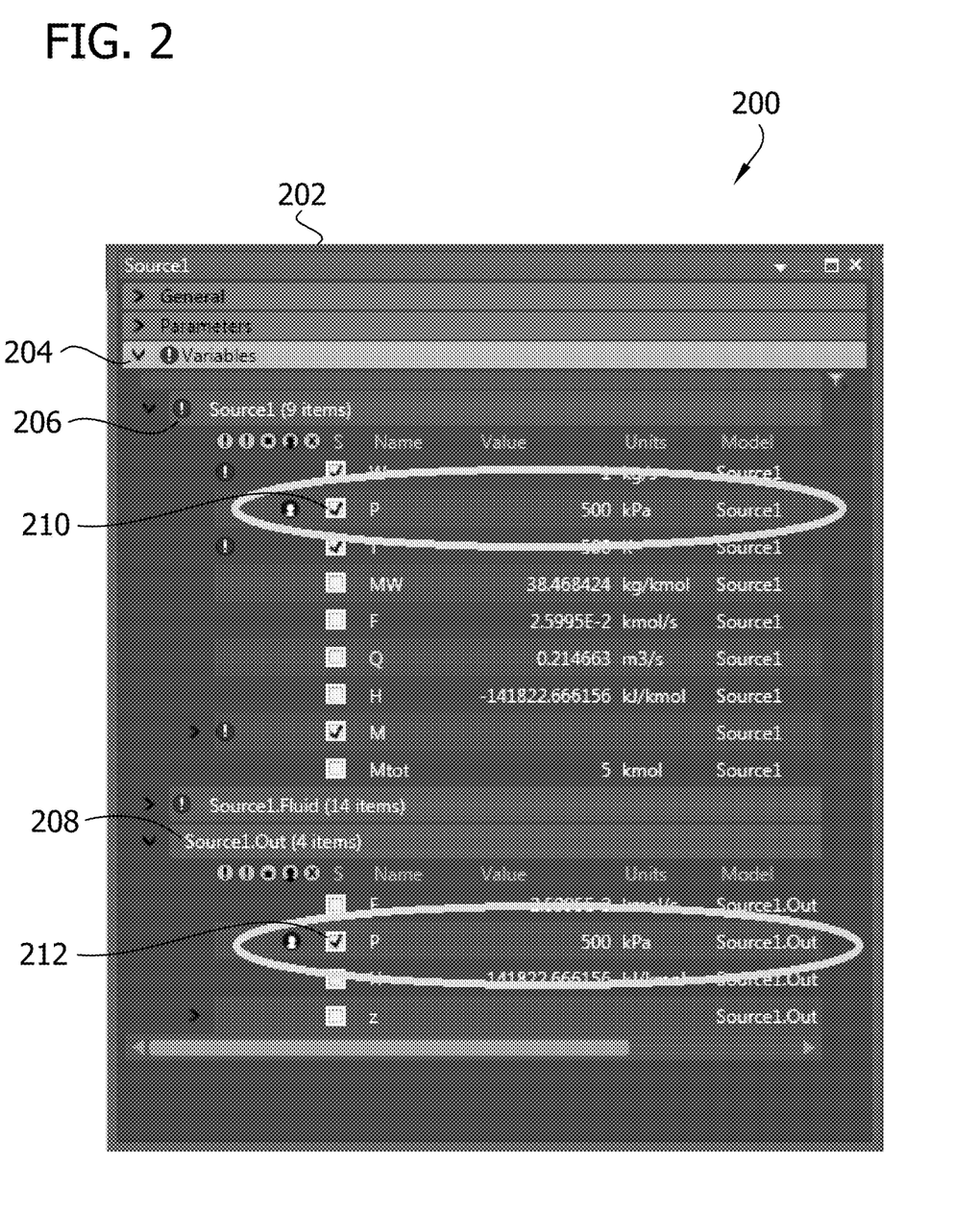
FIG. 2 is a related example of a Property Inspector window for showing the behavior of connected variables in a model instance in the process simulation.

FIG. 2 shows a screen 200 displaying a Property Inspector window 202 related to the Model Editor window 102. The Property Inspector window 202 displays information about a model Source1. Included in that information is a variables tab 204 that displays variables contained in or related to Source1. In a Source1 tab 206, variables contained directly in Source1 are displayed in rows. In a Source1.Out tab 208, variables related to Source1 but contained in a model called "Source1.Out" are displayed in rows. In an embodiment, the model "Source1.Out" is a sub-model of Source1. The Source1 tab 206 shows a row 210 for displaying information about a variable named "P" as referenced in FIG. 1. "P" is shown as having a value of 500 and a unit of kPA and it is associated with model Source1. The Source1.Out tab 208 shows a row 212 for displaying information about a variable named "P", which was referred to as "Out.P" in FIG. 1. The variable "P" of row 212 is shown as having a value of 500 and a unit of kPA and an association to the model "Source1.Out". As a result of the two "P" variables being connected in the Model Editor 102, the variables share values and statuses as shown by the checkboxes and icons in the status columns on the left side of the rows 210 and 212.

A user can add a variable 108 to a model in the Model Editor 102 and specify it for particular Simulation Modes. Choosing to specify a variable for a particular Simulation Mode means that, when the system is solving an equation, that specified variable is defined before solving the equation, rather than being solved for with the equation. This allows a user to determine how different Simulation Modes affect a model and which variables need to be solved for in each Simulation Mode. Variables have a variable type that determines what the variable measures and what units of measure the variable uses.

Advantageously, the system embodying aspects of the invention permits a user to add equations to a model to define mathematical relationships of variables within the model. Equations mathematically represent the behavior of the entity that the model is representing and the act of solving the equations based on the specified variables enables the system to accurately simulate the behavior of the actual system. When a new equation is added to a model or an existing equation is modified, a user writes an expression using the mathematical operators (+, *, /, etc.) and a variety of other mathematical functions (exponential, absolute value, square root, etc.). Equations added to a model can include time derivative equations so that the model can simulate dynamic behavior. These groups of operators and functions are meant merely as examples and do not limit the use of operators and functions that are not listed The system enables a user to add a model as a sub-model of another model. Sub-models are beneficial as they can be used as building blocks to create larger and more complicated models. Multiple levels of sub-models can be used to form a simulation model.

Moreover, the system enables a user to add a parameter to a model. The simulation program according to embodiments of the invention allows integer, real and enumerated parameters. Real parameters use the same variable types as variables. A parameter is like a variable, except that it is constant and defined within the model. A parameter may be included in an equation on a model, but it will always be defined based on what it is set to in the model, and the parameter will never be solved for. Parameters can be connected so that the value of one parameter can be automatically propagated to another parameter.

The display of variables and parameters will also be configured in the Model Editor 102. The definition of the "icon" for the model will be shown in a panel called "Icon". New icons can be associated with a model. The icon to be associated may be in the form of an Extensible Application Markup (XAML) file. Other icon formats may also be used.

The simulation program embodying aspects of the invention includes three Simulation Modes: Process Mode, Fluid Flow Mode, and Dynamics Mode. Process Mode performs steady state Simulations to create and improve process design, Fluid Flow Mode is a steady state simulator that models piping networks and Dynamics Mode simulates system transients over time. A Simulation created in Process Mode, for example, can be switched to Fluid Flow Mode by changing the Mode toggle.

Simulation Mode is toggled between Process, Fluid Flow and Dynamics Mode by selecting the desired mode in the application ribbon on the Process, Fluid Flow and Dynamics tabs, respectively. Process mode is selected upon creation of a new Simulation. The variable specification in the Simulation will automatically change upon switching Modes based on the default settings for each mode for each model. The different Simulation Modes also include options relevant to the mode selected; for example, the ability to automatically solve the simulation in Process Mode and go to a steady state in Dynamic Mode.

Process Mode performs steady state Simulations to create and improve process design. It is designed to perform mass and energy balance calculations. Process Mode is selected on-the-fly under the Mode section. In Process Mode, the variable specification of equipment in the Simulation will change according to the definition for each model. Fluid Flow Mode is a steady state simulator that models piping networks. Fluid Flow Mode can be selected on-the-fly under the Mode section. In Fluid Flow Mode, the variable specification of equipment in the Simulation will change according to the definition for each model. Dynamics Mode simulates system transients over time. Dynamics Mode can be selected on-the-fly under the Mode section. In Dynamics Mode, the Variable specification of equipment in the Simulation will change according to the definition for each model. The modes primarily affect the basic specification of the simulation: which variables are fixed or freed and which parameters, variables, and equations are active or inactive. In the final environment it may also affect the preferred icons available in the icon palette and the specific layers viewable by default.

Figure 3A:
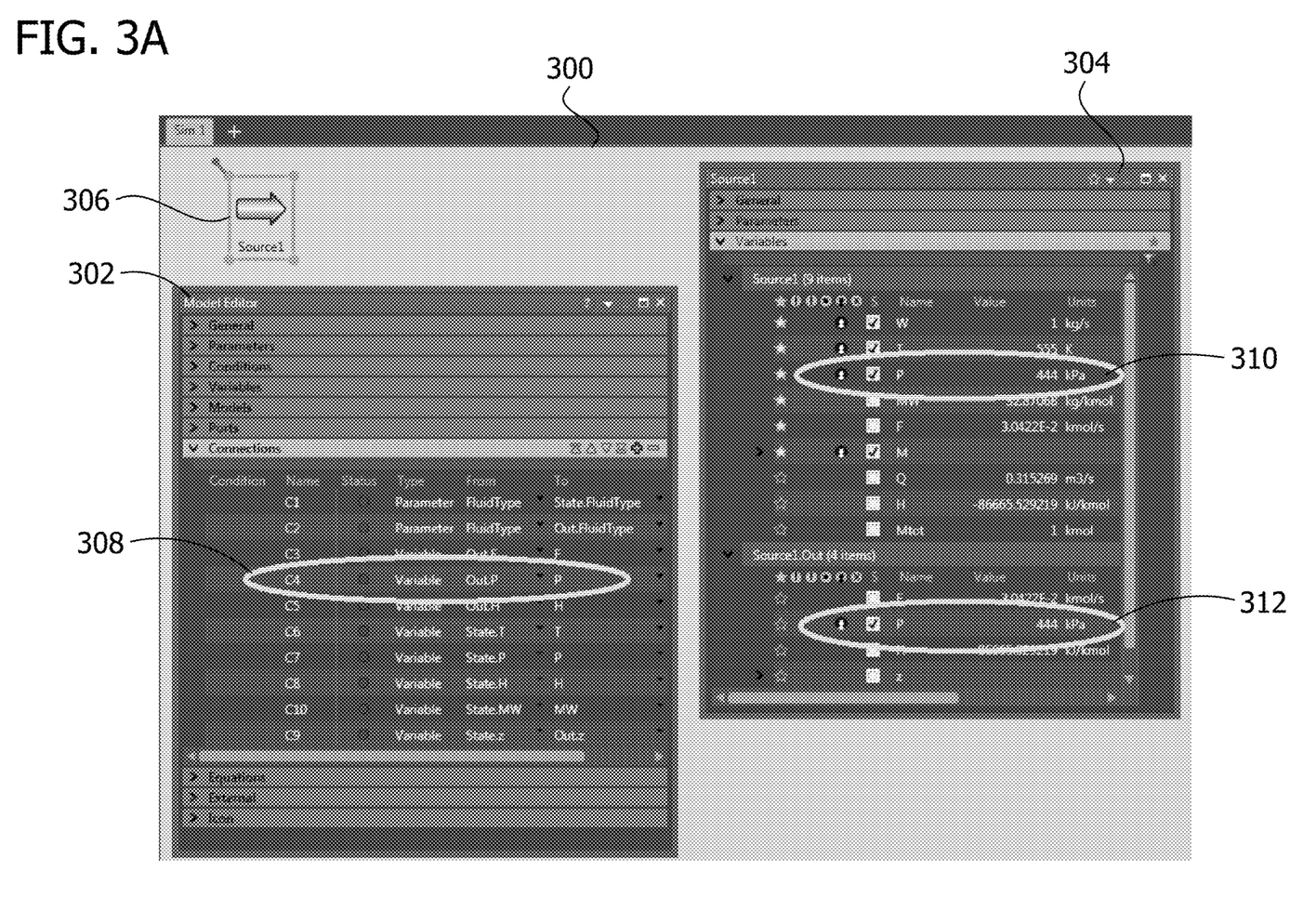
FIG. 3a is an example of a first step in forming a connection on a flowsheet displaying a graphical representation of the process simulation.

FIG. 3a shows a flowsheet screen 300, a model editor window 302, and a model properties window 304. On the flowsheet 300, a simulation model is being built which is composed of a first source model. There is a Source1 model icon 306 placed on the flowsheet screen 300. The model editor window 302 displays a list of connections within the Source1 model 306. On the list, a connection 308 is highlighted. The connection 308 describes a connection within the Source1 model between a sub-model variable Out.P and a variable of Source1 indicated by P. The model properties window 304 displays properties of the Source1 model 306. The model properties window 304 shows a list of properties of the Source1 model and a list of properties of a sub-model named Source1.Out. Two rows of the lists are highlighted. In the Source1 properties list, a row 310 shows a property P of the Source1 model 306. The property P has a value and a unit type, as well as several status icons. In the Source1.Out properties list, a row 312 shows a property P of the Source1.Out sub-model. The row 312 indicates the property P also having a value and a unit type. According to the model editor window 302, the property P of Source1 and the property P of Source1.Out are connected. As a result of them being connected, both properties P indicate the same value. The properties P may also share other properties such as specification or minimum and maximum values. Upon being connected, properties P and Out.P are each assigned to refer to the same memory location or variable, such that their values and other properties are the same so long as they are connected.

Figure 3B:
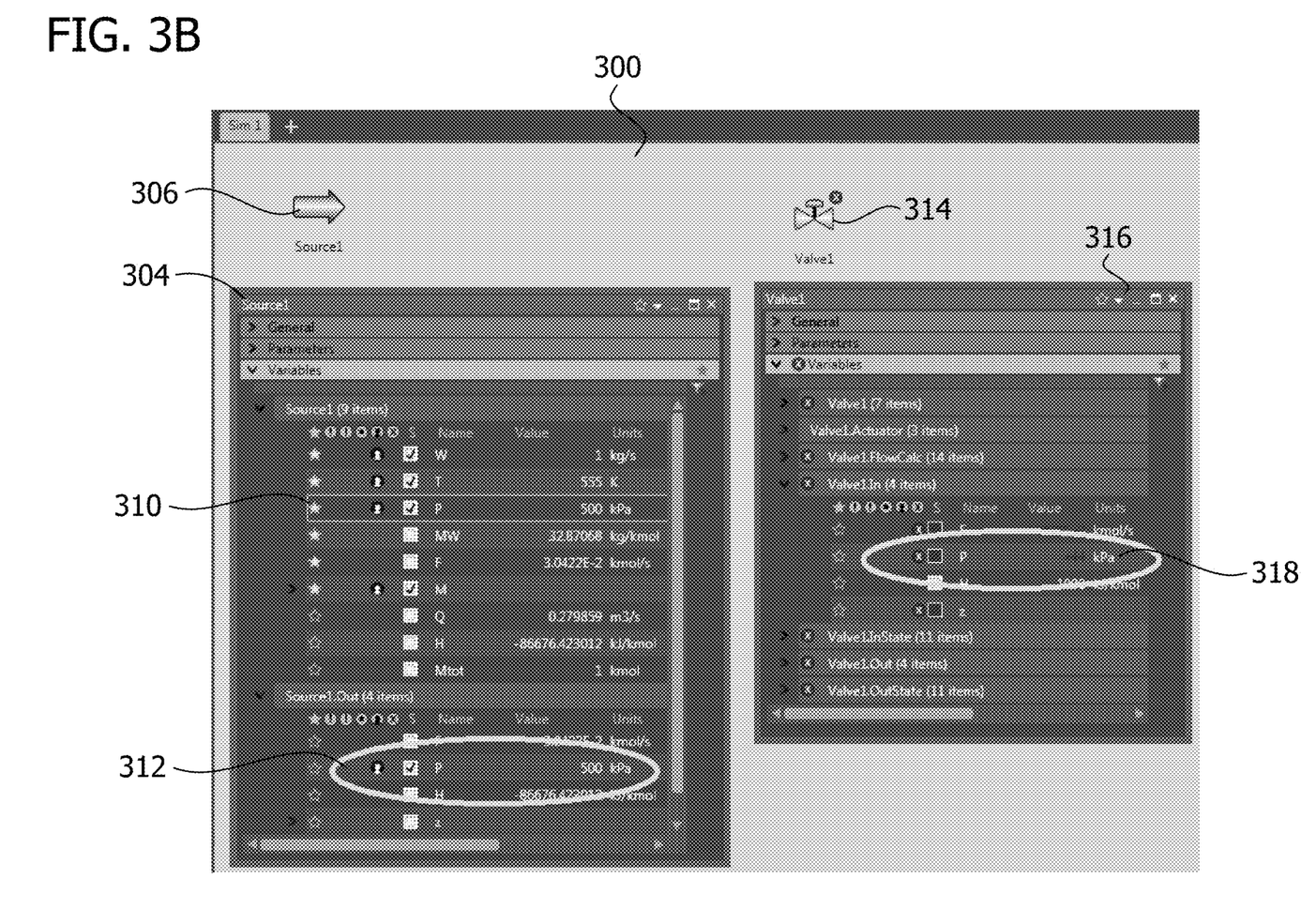
FIG. 3b is an example of a second step in forming a connection on a flowsheet displaying a graphical representation of the process simulation.

In FIG. 3b, the flowsheet 300 of FIG. 3a is shown with an additional Valve1 model 314 added. The Source1 model properties window 304 is displayed. A Valve1 model properties window 316 is displayed. The window 304 displays the property rows 310 and 312 as described in FIG. 3a. The Valve1 model properties window 316 shows a list of properties for a sub-model Valve1. In within the Valve1 model 314. The list of properties contains a highlighted row 318 which describes a property P. The property P of row 318 shows a value and a unit type. The Source1 model and Valve1 model are not connected to each other. Because they aren't connected, the properties P of rows 310 and 312 and the property P of row 318 do not have the same value.

Figure 3C:
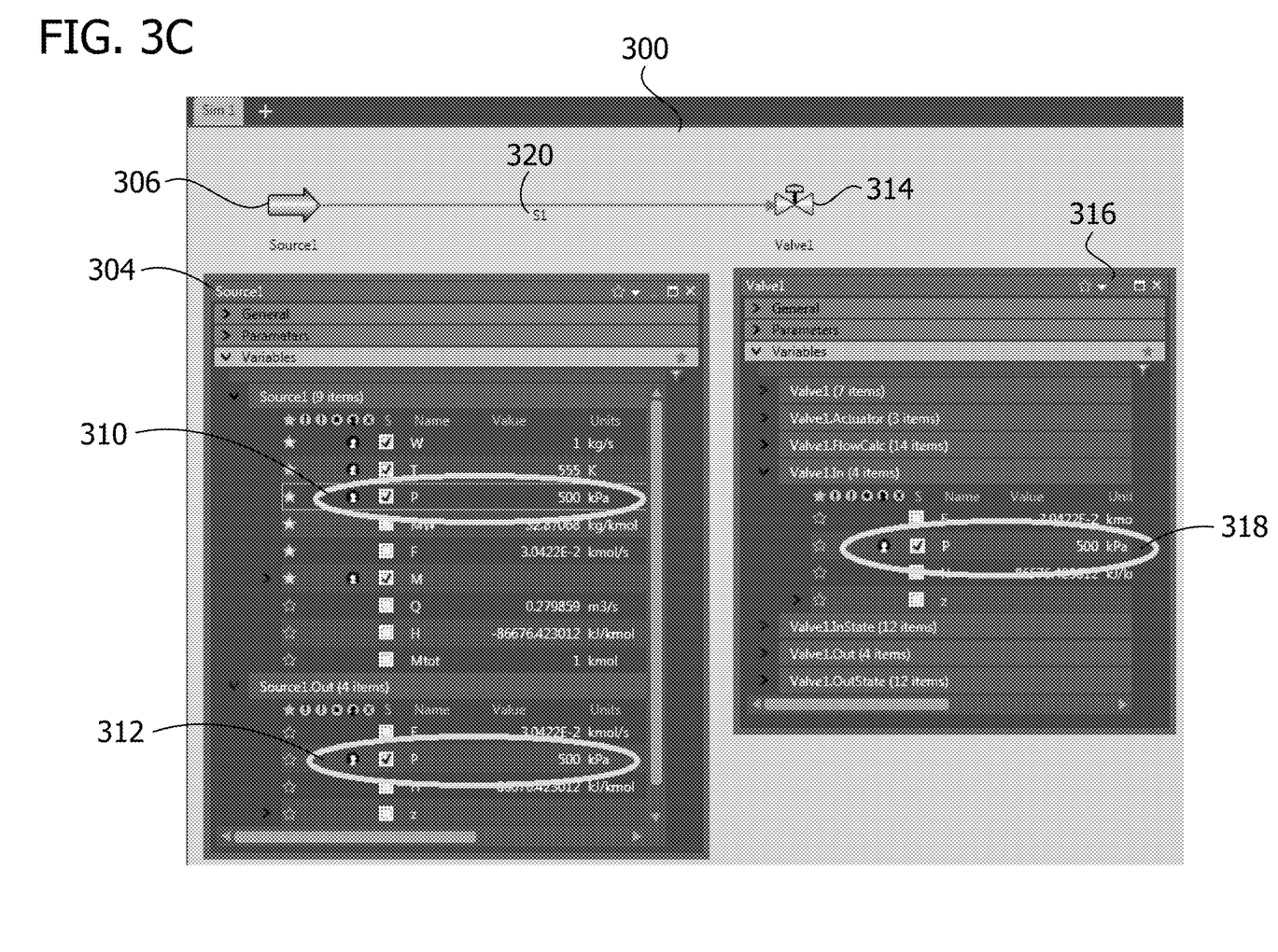
FIG. 3c is an example of a third step in forming a connection on a flowsheet displaying a graphical representation of the process simulation.

In FIG. 3c, the flowsheet 300 of FIGS. 3a and 3b has been modified to include a connection S1 320. The connection S1 320 may be created by a user. In an embodiment, the user may create the connection S1 320 by clicking on a port of one model and dragging a line to a port on another model. In this case, the connection S1 320 is formed between the Source1 model 306 and the Valve1 model 314. The connection S1 320 has been formed between a port on Source1 model 306 associated with the property P of row 312 and a port on Valve1 model 314 associated with the property P of row 318. The value and units of property P of row 318 now match the value and units of property P of row 312 as a result of the connection S1 320 being formed. As stated above, in previous systems the result of the creation of connection S1 320 may result in the creation of a simple equivalency equation which would then be solved among many different equations during simulation. However, in the described system, that equation is instead replaced by a reference to a single memory location or variable associated with the connection S1 310.

Figure 4:
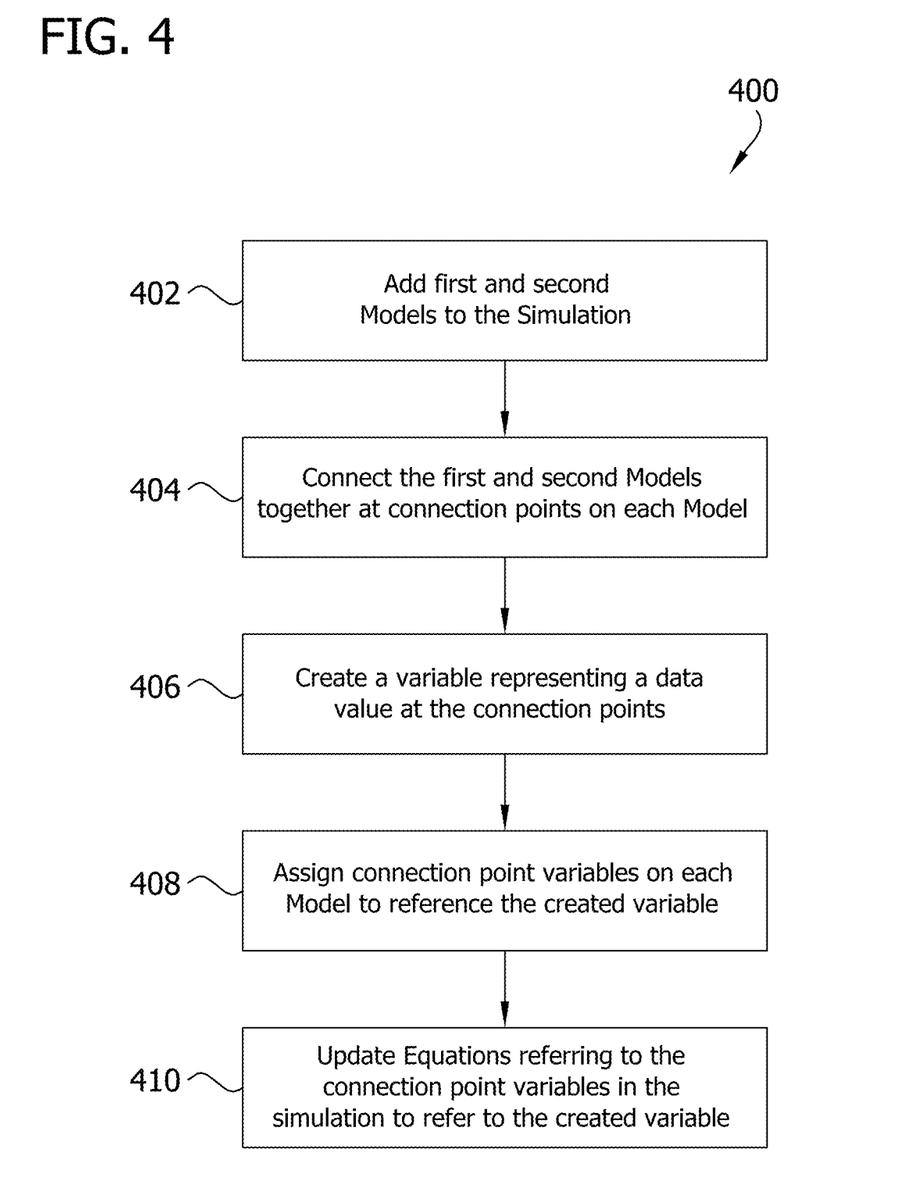
FIG. 4 is an exemplary flowchart describing the steps of forming a connection between two models and updating the process simulation to reflect the connection.

FIG. 4 shows an exemplary flowchart describing the main process of the described system for improving the efficiency of simulation models. In a first step 402, the system is responsive to a user adding a first and second model to the simulation. The user might use the flowsheet view as shown in FIG. 3 to drag and drop the models from the model library onto the flow sheet. The user may also make use of a Model Editor window as shown in FIG. 1 to create the models.

In a second step 404, system is responsive to the user connecting the first and second models together at connection points on each model. This can be seen in FIG. 3 with the connection of the Source1 to the Valve1 via the S1 connector. Models may have multiple connection points (ports) which may be of the same or different types and each connection point may be associated to a variable or parameter of that model. In this step, the user chooses appropriate connection points on both models. The connection points should both be of the same type. For instance, they could both be Fluid ports, but if one was a Fluid port and the other was a Control port, the connection would not be allowed.

In a third step 406, in response to the newly formed connection, the system allocates a memory location representative of a single variable representing a data value at the connection point. The connected variables will be assigned to reference the allocated memory location, such that changes to the value at that memory location result in changes to each of the connected variables. In a fourth step

408, the connection point variables on the two connected models are assigned to refer to the value at the newly allocated memory location. In this way, the connection point variables on the models will always reflect identical values and information for as long as the connection lasts. In an embodiment, the connection points being connected comprise ports which comprise multiple variables. The connection of the ports results in a variable connection being formed between each matching variable of the connected ports. For instance, if a port had four variables and it was connected to a port on another model that also contained those same four variables, four variable connections will be created, one for each matching pair of variables.

In a fifth step 410, the system determines equations that contain the connection point variables of the models and updates the equations with references to the value of the newly allocated memory location. The equations which refer to the connection point variables will then be referring to the same value at that memory location. In this way, there is no need for a simple equivalence equation for the connected variables of the models. Instead, the number of equations and variables is reduced by substituting the value at the allocated memory location as necessary for the connected connection point variables.

Additionally, one of the two models in the above example may be a sub-model and the other may be a model containing that sub-model. There may also be additional sub-models forming connections to the connection variable within the first level sub-model. In this case, several different variables may be eliminated for the purpose of solving the simulation equations.

The first step in analysis is to convert the editable simulation structure (flowsheets, model instances) into a set of numerical equations. This is done by starting at the top level root flowsheet and recursively replacing each model instance with the equations it introduces to the system. Since models in the library may be include parameters, the process of equation generation involves applying current values of parameters, such as the number of thermo components in use, or the conditional inclusion of a sub-model such as a heat loss calculation or compressor head-flow curve. This naturally means that changing a configuration parameter may change the number and type of equations in the system while keeping the same flowsheet topology.

Referring now to partitioning equations into solvable and unsolvable, before any attempt can be made to solve the equations generated from the model they must be checked for consistency and valid specification. Specification problems may include groups of equations that have too many unknown variables for solution ("underspecified") or groups of equations that have too few variables for solution ("over specified"). Both situations may occur at the same time. It is natural for incomplete specifications to occur as a simulation is being constructed and the goal of this step is to ensure the system does not try to solve equations that are not yet ready for solution.

In order to solve a group of solvable equations, there should be an equation for each of the "free" or unsolved variables. In a typical process simulation, many of those equations are simple equivalency equations based on the equivalency of model variables and sub-model variables defined in the Model Editor. For instance, a model containing variable V and also containing sub-model M (which in turn contains variable X) would, without variable connections as described herein, have an equivalence equation "V=M.V". However, by using variable connections instead of equivalence equations, the system can replace references to V or M.V with the same connection variable. For instance, the following set of connections and equations can be reduced according to the process described above:

Connection: A→B
Connection: B→C
Connection: A→D
Equation: A function of A, E, and F
Equation: A function of C and F
Equation: A function of D and E The described system recognizes that A, B, C, and D are all equivalent to each other due to being related with variable connections and it will treat the variables as being equivalent in order to simplify the equation set. The system may set A, B, C, and D equal to a single value at an allocated memory location represented by variable Z, which represents the connection of the variables. This eliminates the first three connection equations. The variable Z is then substituted for the equivalents in the other three equations, which results in run-time equations which behave as:

Equation: A function of Z, E, and F
Equation: A function of Z and F
Equation: A function of Z and E In another embodiment, a typical process simulation may comprise many simple equivalency equations based on two ports being connected which a user may manually add to the simulation. For instance, port X being connected to port Y results in one or more equations of the form "X.V=Y.V", where "V" is a variable in the port. As described above, the system would eliminate that equation and replace references to X.V or Y.V with the same variable. For instance, suppose that Model M1 contains a port OUT which in turn contains two variables P and T. Also suppose that model M2 contains a port IN which in turn contains variables P and T. When a connection is made between M1.OUT and M2.IN this would, without the variable connections described herein, result in two additional equations being added to the simulation:

Equation: M1.OUT.P=M2.IN.P
Equation: M1.OUT.T=M2.IN.T

However, because of the variable connections feature, the system actually uses the fact that M1.0UT and M2.IN are connected to define variable connections, not equations, and therefore the following connections are created:

Connection: M1.OUT.P→M2.IN.P
Connection: M1.OUT.T→M2.IN.T

As a result, the system is better able to solve the equations quickly and therefore more quickly simulate the behavior of the process control system. The system will treat the variable in each connection as being equivalent to each other in order to simplify the equation set. The system may set M1.OUT.P and M2.IN.P to a single connected variable represented by variable Z1, and also set M1.OUT.T and M2.IN.T to a single connected variable represented by variable Z2. The variables Z1 and Z2 are then used for the equivalents in other equations used in the simulation. If one of the new variables is deleted, the system is capable of alerting the user that the connection now references a variable that no longer exists. The user may then respond to the alert in an appropriate way by removing the connection or creating a new variable to add to the connection. If the connection is deleted, the reference that has been created by the system representing the connection will automatically be removed from the simulation and the previously connected variables may revert back to a previous state.

Variables that have been connected in this manner take on the properties of a single variable. Preferably, they maintain the same data values as well as other related properties. For instance, if one of the variables that has been connected is a "required" variable, then all of the variables connected to the connection will also be considered "required". Other properties may also be shared between connected variables, such as if a variable is specified or calculated. If any of the connected variables have a default value, then that becomes the default for all of the connected variables as well.

In the event that connected variables have different properties from each other, the system decides which properties to maintain for the connection. For example, if the connected variables have multiple default values, the system may decide to use the largest default value across all of the connected variables. If a user specifies a certain default for one of the connected variables, then that specified default may override all other defaults of the connected variables.

If the connected variables have minimum and maximum values, then the system chooses which value limits to maintain. In an embodiment, the system maintains the minimum and maximum values that provide the widest range, unless otherwise specified. The rules the system follows to determine these shared properties can also be altered by a user as desired, but a user should be careful about setting a minimum value higher than the maximum value.

The system preferably maintains a connection graph derived from information about the parameters and variables of the system and how they are connected to each other. In an embodiment, the connection graph maintains information about the connections between the various parameters in order to propagate values between connected parameters or highlight inconsistent values between connected parameters. For example, connected parameters having conflicting default values are highlighted and then fixed by a user who is configuring the simulation.

In an embodiment, the connection graph contains vertices that represent particular connections. The vertices are bound to particular names, independent of the objects which they connect. In this way, objects may be added and removed from a particular connection vertex without the need to alter the name of the vertex. A vertex may have a particular value, which is propagated to each of the objects connected to the vertex, and it may have a type which defines the type of data flowing through the connection.

For purposes of illustration, programs and other executable program components, such as the operating system, are illustrated herein as discrete blocks. It is recognized, however, that such programs and components reside at various times in different storage components of a computing device, and are executed by a data processor(s) of the device.

Although described in connection with an exemplary computing system environment, embodiments of the aspects of the invention are operational with numerous other general purpose or special purpose computing system environments or configurations. The computing system environment is not intended to suggest any limitation as to the scope of use or functionality of any aspect of the invention. Moreover, the computing system environment should not be interpreted as having any dependency or requirement relating to any one or combination of components illustrated in the exemplary operating environment. Examples of well-known computing systems, environments, and/or configurations that may be suitable for use with aspects of the invention include, but are not limited to, personal computers, server computers, handheld or laptop devices, multiprocessor systems, microprocessor-based systems, set top boxes, programmable consumer electronics, mobile telephones, network PCs, minicomputers, mainframe computers, distributed computing environments that include any of the above systems or devices, and the like.

Embodiments of the aspects of the invention may be described in the general context of data and/or processor-executable instructions, such as program modules, stored one or more tangible, non-transitory storage media and executed by one or more processors or other devices. Generally, program modules include, but are not limited to, routines, programs, objects, components, and data structures that perform particular tasks or implement particular abstract data types. Aspects of the invention may also be practiced in distributed computing environments where tasks are performed by remote processing devices that are linked through a communications network. In a distributed computing environment, program modules may be located in both local and remote storage media including memory storage devices.

In operation, processors, computers and/or servers may execute the processor-executable instructions (e.g., software, firmware, and/or hardware) such as those illustrated herein to implement aspects of the invention.

Embodiments of the aspects of the invention may be implemented with processor-executable instructions. The processor-executable instructions may be organized into one or more processor-executable components or modules on a tangible processor readable storage medium. Aspects of the invention may be implemented with any number and organization of such components or modules. For example, aspects of the invention are not limited to the specific processor-executable instructions or the specific components or modules illustrated in the figures and described herein. Other embodiments of the aspects of the invention may include different processor-executable instructions or components having more or less functionality than illustrated and described herein.

The order of execution or performance of the operations in embodiments of the aspects of the invention illustrated and described herein is not essential, unless otherwise specified. That is, the operations may be performed in any order, unless otherwise specified, and embodiments of the aspects of the invention may include additional or fewer operations than those disclosed herein. For example, it is contemplated that executing or performing a particular operation before, contemporaneously with, or after another operation is within the scope of aspects of the invention.

When introducing elements of aspects of the invention or the embodiments thereof, the articles "a," "an," "the," and "said" are intended to mean that there are one or more of the elements. The terms "comprising," "including," and "having" are intended to be inclusive and mean that there may be additional elements other than the listed elements.

In view of the above, it will be seen that several advantages of the aspects of the invention are achieved and other advantageous results attained.

Not all of the depicted components illustrated or described may be required. In addition, some implementations and embodiments may include additional components. Variations in the arrangement and type of the components may be made without departing from the spirit or scope of the claims as set forth herein. Additional, different or fewer components may be provided and components may be combined. Alternatively or in addition, a component may be implemented by several components.

The above description illustrates the aspects of the invention by way of example and not by way of limitation. This description enables one skilled in the art to make and use the aspects of the invention, and describes several embodiments, adaptations, variations, alternatives and uses of the aspects of the invention, including what is presently believed to be the best mode of carrying out the aspects of the invention. Additionally, it is to be understood that the aspects of the invention is not limited in its application to the details of construction and the arrangement of components set forth in the following description or illustrated in the drawings. The aspects of the invention are capable of other embodiments and of being practiced or carried out in various ways. Also, it will be understood that the phraseology and terminology used herein is for the purpose of description and should not be regarded as limiting.

Having described aspects of the invention in detail, it will be apparent that modifications and variations are possible without departing from the scope of aspects of the invention as defined in the appended claims. It is contemplated that various changes could be made in the above constructions, products, and process without departing from the scope of aspects of the invention. In the preceding specification, various preferred embodiments have been described with reference to the accompanying drawings. It will, however, be evident that various modifications and changes may be made thereto, and additional embodiments may be implemented, without departing from the broader scope of the aspects of the invention as set forth in the claims that follow. The specification and drawings are accordingly to be regarded in an illustrative rather than restrictive sense.

The Abstract is provided to help the reader quickly ascertain the nature of the technical disclosure. It is submitted with the understanding that it will not be used to interpret or limit the scope or meaning of the claims.

What is claimed is:

1. A system for developing a simulation of a process that improves the rate at which a processor executing the simulation can solve mathematical equations thereof, the system comprising:
    a processor configured to receive data relating to the process;
    a memory device coupled to the processor; and
    software instructions stored on the memory device and executable by the processor, said instructions comprising:
        instructions for generating a first model in the simulation, representing a first portion of the process, said first model comprising a first port to which other models are connectable, and said first model further comprising a first set of one or more mathematical equations representative of a behavior of the first portion of the process, at least one of said mathematical equations including a first port variable representative of a value transferable through the first port;
        instructions for generating a second model in the simulation, representing a second portion of the process, said second model comprising a second port to which other models are connectable, and said second model further comprising a second set of one or more mathematical equations representative of a behavior of the second portion of the process, at least one of said mathematical equations including a second port variable representative of a value transferable through the second port;
        instructions for allocating a memory location in the memory device as a connection variable representative of a type of information transfer between the first model and the second model; and
        instructions for reducing the number of equations to be solved during execution of the simulation by setting, in response to said allocating the memory location, the first port variable in the at least one mathematical equation of the first set and the second port variable in the at least one mathematical equation of the second set to reference the value of the allocated memory location, thereby substituting the value of the allocated memory location for the first port variable in the at least one mathematical equation of the first set and the second port variable in the at least one mathematical equation of the second set as a result of said setting, and
        thereby obviating the need for an equivalence equation to link the first port variable and the second port variable.

2. The system of claim 1, the software instructions further comprising:
    instructions for creating a third model in the simulation, representing a third portion of the process, said third model comprising a third port to which other models are connectable, and said third model further comprising a third set of one or more mathematical equations representative of a behavior of the third portion of the process, at least one of said mathematical equations including a third port variable representative of a value transferable through the third port;
    instructions for connecting the third port to the first port and second port in the simulation; and
    instructions for substituting the value of the allocated memory location for the third port variable in the at least one mathematical equation of the third set in response to connecting the third port to the first and second ports,
    wherein said substituting further reduces the number of equations to be solved during execution of the simulation by obviating the need for one or more equivalence equations to link the third port variable to the first port variable and the second port variable.

3. The system of claim 1, the software instructions further comprising:
    instructions for connecting the first port to the second port;
    wherein connecting the first port to the second port comprises connecting an icon of the first model on a flowsheet and an icon of the second model on a flowsheet with a line.

4. The system of claim 1, wherein the first port variable has a default value and that default value is assigned to the connection variable when the value of the allocated memory location is substituted for the first port variable.

5. The system of claim 1, wherein the first port variable has minimum and maximum value constraints and those constraints are assigned to the connection variable when the value of the allocated memory location is substituted for the first port variable.

6. The system of claim 5, wherein the second port variable has a minimum value constraint greater than the minimum value constraint of the first port variable and a maximum value constraint less than the maximum value constraint of the first port variable and the minimum and maximum value constraints of the first port variable are assigned to the connection variable.

7. The system of claim 1, wherein the first port variable has required status for the function of the first model and the connection variable inherits the required status of the first port variable, causing the second port variable to gain required status.

8. A method of developing a simulation of a process that improves the rate at which a processor executing the simulation can solve mathematical equations thereof, the method comprising:
creating a first model in the simulation representing a first portion of the process, said first model comprising a first port to which other models are connectable, and said first model further comprising a first set of one or more mathematical equations representative of a behavior of the first portion of the process, at least one of said mathematical equations including a first port variable representative of a value transferable through the first port;
creating a second model in the simulation representing a second portion of the process, said second model comprising a second port to which other models are connectable, and said second model further comprising a second set of one or more mathematical equations representative of a behavior of the second portion of the process, at least one of said mathematical equations including a second port variable representative of a value transferable through the second port;
connecting the first port to the second port in the simulation;
allocating a memory location in a memory storage device as a connection variable representative of a type of information transfer between the first model and the second model based on characteristics of the first port and the second port; and
reducing the number of equations to be solved during execution of the simulation by updating, in response to said allocating, the at least one equation of the first set to reference the value of the allocated memory location in place of the first port variable and updating, in response to said allocating, the at least one equation of the second set to reference the value of the allocated memory location in place of the second port variable,
wherein said reducing limits the number of equations to be solved for the first and second models during execution of the simulation to the number of equations comprising the first and second sets of mathematical equations, thereby obviating the need for an equivalence equation to link the first port variable and the second port variable.

9. The method of claim 8, further comprising:
creating a third model in the simulation representing a third portion of the process, said third model comprising a third port to which other models are connectable, and said third model further comprising a third set of one or more mathematical equations representative of a behavior of the third portion of the process, at least one of said mathematical equations including a third port variable representative of a value transferable through the third port;
connecting the third port to the first port and second port in the simulation; and
updating, in response to connecting the third port to the first and second ports, the at least one equation of the third set to reference the value of the allocated memory location in place of the third port variable,
wherein said updating limits the number of equations to be solved for the first, second, and third models during execution of the simulation to the number of equations comprising the first, second, and third sets of mathematical equations by obviating the need for one or more equivalence equations to link the third port variable to the first port variable and the second port variable.

10. The method of claim 8, wherein connecting the first port to the second port comprises connecting an icon of the first model on a flowsheet and an icon of the second model on a flowsheet with a line.

11. The method of claim 8, wherein the first port variable has a default value and that default value is assigned to the connection variable when the at least one equation of the first set is updated to reference the value of the allocated memory location in place of the first port variable.

12. The method of claim 8, wherein the first port variable has minimum and maximum value constraints and those constraints are assigned to the connection variable when the at least one equation of the first set is updated to reference the value of the allocated memory location in place of the first port variable.

13. The method of claim 12, wherein the second port variable has a minimum value constraint greater than the minimum value constraint of the first port variable and a maximum value constraint less than the maximum value constraint of the first port variable and the minimum and maximum value constraints of the first port variable are assigned to the connection variable.

14. The method of claim 8, wherein the first port variable has a property status and the connection variable inherits the property status of the first port variable, causing the second port variable to gain the property status.

15. A system for developing a simulation of a process that improves the rate at which a processor executing the simulation can solve mathematical equations thereof, the system comprising:
a processor configured to receive data from one or more sensors of the process;
a memory device coupled to the processor;
software instructions stored on the memory device and executable by the processor, said instructions comprising:
instructions for generating a model in the simulation representing a portion of the process, said model comprising a first port to which other models are connectable, and said model further comprising a first set of one or more mathematical equations representative of a behavior of the portion of the process, at least one of said mathematical equations including a first port variable representative of a value transferable through the first port;
instructions for generating a sub-model of the model in the simulation, representing a sub-portion of the portion of the process, said sub-model comprising a second port to which other models are connectable, and said sub-model further comprising a second set of one or more mathematical equations representative of a behavior of the sub-portion of the process, at least one of said mathematical equations including a second port variable representative of a value transferable through the second port;
instructions for defining a connection between the first port and the second port;
instructions for allocating a memory location in the memory device as a connection variable in response to said defining the connection between the first port and the second port, said connection variable representative of a type of information transfer between the first model and the model port based on characteristics of the first port and the second port; and instructions for reducing the number of equations to be solved during execution of the simulation by setting the first port variable in the at least one mathematical equation of the first set to reference the value of the allocated memory location in response to said allocating the memory location and setting the second port variable in the at least one mathematical equation of the second set to reference the value of the allocated memory location in response to said allocating the memory location, thereby substituting the value of the allocated memory location for the first port variable in the at least one mathematical equation of the first set and the second port variable in the at least one mathematical equation of the second set as a result of said setting, and thereby obviating the need for an equivalence equation to link the first port variable and the second port variable.

16. The system of claim 15, wherein the second port variable has a default value and that default value is assigned to the connection variable when the second port variable is replaced by the value of the allocated memory location.

17. The system of claim 15, wherein the first port variable has a property and the connection variable inherits the property of the first port variable, causing the second port variable to gain the property.

* * * * *